United States Patent [19]

Hughes

[11] Patent Number: 5,109,169

[45] Date of Patent: Apr. 28, 1992

[54] INTEGRATOR CIRCUIT

[75] Inventor: John B. Hughes, Hove, England

[73] Assignee: U.S. Philips Corporation, New York, N.Y.

[21] Appl. No.: 559,810

[22] Filed: Jul. 30, 1990

[30] Foreign Application Priority Data

Aug. 7, 1989 [GB] United Kingdom ............... 8917999

[51] Int. Cl.⁵ .............................................. H03K 5/00
[52] U.S. Cl. .................................... 307/490; 307/353; 307/246
[58] Field of Search ............... 307/352, 353, 490, 491, 307/572, 240, 246; 330/288; 328/127; 323/315, 316

[56] References Cited

U.S. PATENT DOCUMENTS

| | | | |
|---|---|---|---|
| 3,671,782 | 6/1972 | Wittlinger et al. | 307/353 |
| 4,429,281 | 1/1984 | Ito et al. | 328/127 |
| 4,785,250 | 11/1988 | Lawton | 328/127 |
| 4,839,542 | 6/1989 | Robinson | 328/127 |
| 4,845,382 | 7/1989 | Eouzan et al. | 307/353 |
| 4,864,217 | 9/1989 | Bird | 307/353 |
| 4,958,123 | 9/1990 | Hughes | 307/353 |

OTHER PUBLICATIONS

John B. Hughes, Neil C. Bird and Ian C. MacBeth entitled; ISCAS, Feb. 1989; pp. 1584–1587, "Switched Currents—A New Technique for Analog Sampled-Data Signal Processing".

*Primary Examiner*—Stanley D. Miller
*Assistant Examiner*—Toan Tran
*Attorney, Agent, or Firm*—Bernard Franzblau

[57] ABSTRACT

An integrator circuit for input signals consisting sampled analogue currents has an input connected to a node (2). Also connected to the node (2) are a first current memory cell (C1, T1, S2) and a second current memory cell (C2, T2, T3, S3). The switches (S1, S3) are operated on opposite phases of a clock signal synchronized with the sampling period. The first current memory cell produces an output current when switch (S2) is open, whereas the second current memory cell produces a first output when switch (S3) is open and a second output (T3) which is connected to the output (6) of the integrator and which is continuously available. Forward or Backward Euler mapping is produced by closing switch (S1) on appropriate phases of the clock signal. A Bilinear mapping can be produced by connecting an inverted version of the input signal to a second input (8) and appropriately clocking the switches (S1, S4). A feedforward function can be added by the use of a further input (9) directly connected to the node (2).

Various higher performance current memory cells are also disclosed together with fully differential versions of the integrator.

21 Claims, 6 Drawing Sheets

INTEGRATOR CIRCUIT

BACKGROUND OF THE INVENTION

This invention relates to an integrator circuit comprising an input for receiving an input signal in the form of a sampled analog current, an output at which, in operation, the integrated input signal is made available in the form of a sampled analog current, a first current memory cell having an input connected to the input of the integrator circuit and an output connected to the input of a second current memory cell, the second current memory cell having a first output connected to the input of the first current memory cell and a second output connected to the output of the integrator circuit.

Such an integrator circuit has been disclosed in a paper by J. B. Hughes, N. C. Bird, and I. C. MacBeth entitled "Analog sampled-dated signal processing for VLSI using switched currents" presented at the IEE Colloquim on Current-Mode Analog Circuits on 17th Feb. 1989.

The integrator circuit disclosed in the paper depends on the matching between transistors to define the feedback current from the second to the first current memory cell. When producing ideal, i.e. lossless, integrators there is the possibility of the circuit becoming unstable if the loop gain becomes greater than one, that is if the matching errors are such that the feedback signal steadily increases. Similarly, when high Q circuits are required the integrator response becomes very sensitive to errors in transistor matching.

SUMMARY OF THE INVENTION

It is an object of the invention to provide an integrator as set forth in the opening paragraph which is less sensitive to the matching between individual transistors.

The invention provides an integrator circuit as set forth in the opening paragraph characterised in that the output current of the first current memory cell is produced by the same device(s) as receive the input current, and the output current at the first output of the second current memory cell is produced by the same device(s) as receive the input current.

By causing the current memory cells to use the same device(s) to produce the output current as is/are used to sense the input current the problem of device mismatch is eliminated. This does not of course hold for the second output of the second memory cell, but as this is not in the feedback path it causes a constant gain error but does not affect the integration process a it is not added to the input current in each sampling period.

In an embodiment which enables signal currents only to be passed between one or more integrator circuits or circuit modules performing other functions, the integrator circuit input, the inputs of the first and second memory cells, the output of the first current memory cell, the first output of the second current memory cell and a source of bias current are connected to a single node, the bias current enabling signals of both polarities to be integrated.

The first current memory cell may comprise a MOS field effect transistor having a switch connected between its gate and drain electrode, the input current being applied when the switch is closed and the output current being available when the switch is open. Means are provided for controlling the operation of the switch via a clock signal synchronised with the sampling period of the input analog current.

A further capacitor, in addition to the inherent gate/source capacitance, may be connected between the gate and source electrodes of the transistor.

A cascade connected transistor may be connected with its source-drain path between the drain electrode of the first transistor and the switch in one or both of the current memory cells.

The first and/or second memory cell may comprise a modified current conveyor circuit, the modification comprising switching means synchronised with the sampling period of the input analog current for causing, when the switch is in a first state, the current conveyor circuit to monitor the current applied to its x-input and, when the switch is in a second state to reproduce at its x-input the current applied to the x-input when the switching means was in its first state. The current conveyor may be a Class II current conveyor. For additional background information on current conveyors, see U.S. Pat. No. 3,582,689 Jun. 1, 1971.

By constructing the memory cell sin the form of modified current conveyors advantage can be taken of the very low input impedance of the x-input of the current conveyor circuit to maximise the accuracy of current summing at the input.

The integrator circuit may comprise a differential amplifier having an inverting input connected to a source of bias potential, and a non-inverting input connected to the drain electrode of the field effect transistor in the first and/or second current memory cell, wherein the switch(es) is/are connected to the output of the amplifier instead of to the drain electrode of the respective transistor.

This gives a low impedance at the input of the current memory cell to increase the accuracy of current summing at the input.

The second current memory cell may have a third output which is connected to the node only when the input of the second current memory cell is connected to the node.

This enables a lossy integrator to be produced which can have a well defined loss factor.

The second current memory cell may have a fourth output which is connected to the node when the input of the first current memory cell is connected to the node, but not when the input of the second current memory cell is connected to the node. This provides a further improvement in the definition of the loss factor by allowing cancellation of errors due to edge effects in the MOS transistors.

The integrator may be arranged to integrate differential input signals and comprises first and second inputs for receiving a differential input signal and first and second outputs for making available a differential output signal, wherein the integrator comprises first and second integrators as described below and as claimed in any of claims 1 to 8, the first and second integrators being identical in form and having their outputs combined to form the differential output signal.

This enables the processing of differential signals with the advantages which can be obtained, such as reduced sensitivity to common mode interference signals and cancellation of even order harmonic distortion.

BRIEF DESCRIPTION OF THE DRAWINGS

Embodiments of the invention will now be described, by way of example, with references to the accompanying drawings, in which.

DESCRIPTION OF THE PREFERRED EMBODIMENTS

Figure 1:
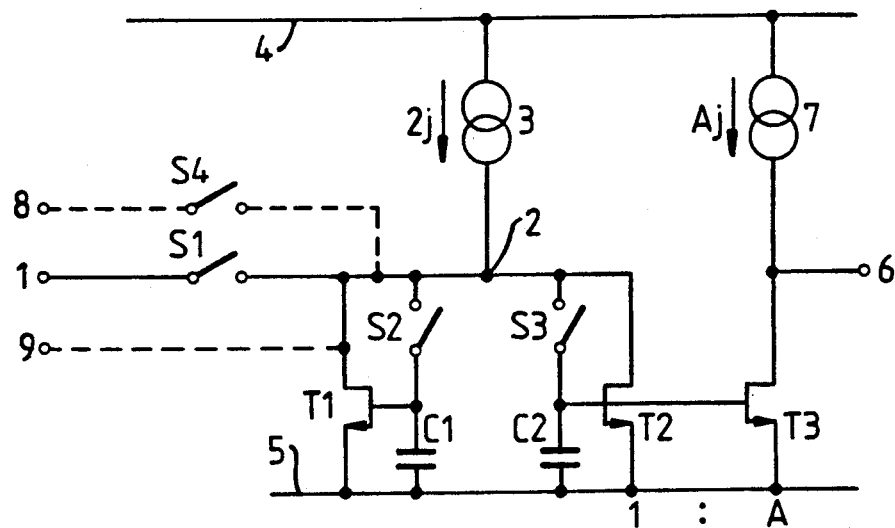
FIG. 1 is a circuit diagram of a first embodiment of an integrator circuit according to the invention.

FIG. 1 shows a circuit diagram of a first embodiment of an integrator circuit according to the invention which comprises an input 1 connected to a node 2 via a switch S1. Also connected to the node 2 are a current source 3, the drain electrodes of first and second n-channel field effect transistors T1 and T2 and second and third switches S2 and S3. The other end of the current source 3 is connected to a positive supply rail 4 while the source electrodes of transistors T1 and T2 are connected to a negative supply rail 5. The other side of switch S2 is connected to the junction of the gate electrode of transistor T1 and is capacitor C1, while the other side of switch S3 is connected to the junction of the gate electrode of transistor T2 and a capacitor C2. The other sides of capacitors C1 and C2 are connected to the negative supply rail 5. The gate electrode of transistor T2 is connected to the gate electrode of a further n-channel field effect transistor T3 whose source electrode is connected to the negative supply rail 3. The drain electrode of transistor T3 is connected to an output 6 and via a current source 7 to the positive supply rail 4.

Figure 2:
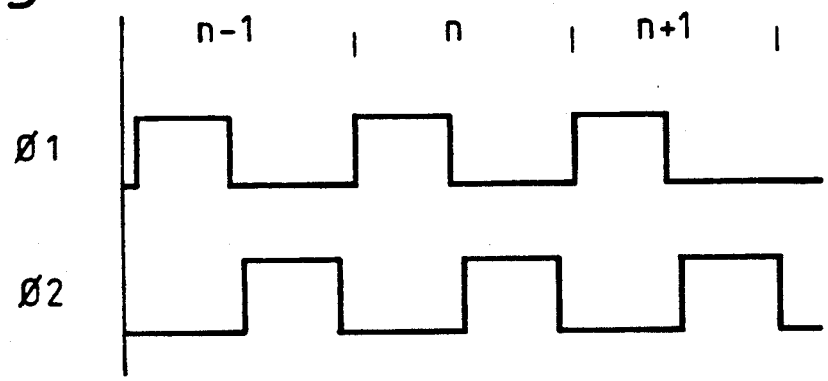
FIG. 2 is a timing diagram showing clock signals used to operate switches in the embodiments shown herein.

FIG. 2 shows waveforms of the control signals which operate the switches S1 to S3. The switches S1 and S3 are closed in the portion of each sampling period during which the signal $\phi 1$ is high, hereinafter called the portion $\phi 1$, while the switch S2 is closed in the portion of each sampling period during which the signal $\phi 2$ is high, hereinafter called the portion $\phi 2$. The input applied to input 1 comprises a sampled current which may be constant for the whole of a sampling period. The output at output 6 will be constant for the whole of a sampling period if the settling time of the integrator is neglected.

The integrator shown in FIG. 1 comprises an input 1 for receiving the input signal and an output 6 at which the integrated input signal is made available. A first current memory cell comprises transistor T1, switch S2 and capacitor C1. The capacitor C1 may be the inherent gate capacitance of transistor T1 or may be augmented by the provision of additional capacitance. The drain electrode of transistor T1 forms the input of the current memory cell when the switch S2 is closed and forms the output of the current memory cell when the switch S2 is open. A second current memory cell comprises transistor T2, switch S3 and capacitor C2 and is constructed and operates substantially the same as the first current memory cell. However, the second current memory cell has a second output from the drain electrode of transistor T3. Transistor T3 mirrors the current in transistor T2 and may be scaled in dimensions to produce a scaled output current at the second output.

Although the integrator shown in FIG. 1 and the integrators in the embodiments shown in FIGS. 3 to 11 use n-channel field effect transistors, it would be possible to use p-channel field effect transistors with appropriate changes in polarity of power supplies and current sources. As will be seen hereinafter, various modifications can be made to the current memory cells to improve the performance of the integrator and such modified current memory cells can be used in any combination in any of the integrator circuits disclosed herein in either n-channel or p-channel form or in a mixture of the two.

The operation of the integrator shown in FIG. 1 can be analysed as follows:

During portion $\phi 2$ of sampling period $(n-1)$ the current $T_1$ through transistor T1 is given by the relationship $$I_1 = 2j - I_2 = 2j - I_3/A = j + i_0(n - 1)/A$$
$$I_3/A = j - i_0(n - 1)/A$$

where $I_2$ is the current through transistor T2,
$I_3$ is the current through transistor T3 and
$i_0(n-1)$ is the current at output 6 in sampling period $(n-1)$ During portion $\phi 1$ of sampling period n $$I_3/A = I_2 = 2j - I_1 + i(n)$$

where $i(n)$ is the current at input 1 during sampling period in $$I_3 = Aj - i_0(n - 1) + Ai(n)$$
$$i_0(n) = Aj - I_3$$
$$= i_0(n - 1) - Ai(n)$$

Transforming to the z-domain $$i_0(z) - i_0(z)z^{-1} = -Ai(n)$$

$$H(z) = \frac{i_0(z)}{i(z)} = -\frac{A}{1 - z^{-1}}$$

Thus a Backward Euler Ideal Integrator has been implemented.

To implement a Forward Euler Ideal Integrator, the switches S1 and S2 are closed during the portion $\phi 2$ of each sampling period while the switch S3 is closed during the portion $\phi 1$ of each sampling period. The operation of such an integrator can be analysed as follows using the same symbols as for the Backward Euler analysis.

During the portion $\phi 2$ of sampling period $(n-1)$ $$\begin{aligned} I_1 &= 2j + i(n-1) - I_2 \\ &= 2j + i(n-1) - [j - i_o(n-1)/A] \\ &= j + i(n-1) + i_o(n-1)/A. \end{aligned}$$

During the portion $\phi 1$ of sampling period n $$\begin{aligned} I_2 &= I_3/A = j - i_o(n)/A \\ &= 2j - I_1 \\ &= 2j - [j + i(n-1) + i_o(n-1)/A]. \end{aligned}$$
$$j - i(n-1) - i_o(n-1)/A = j - i_o(n)/A$$
$$i(n-1) + i_o(n-1)/A = i_o(n)/A$$

Transforming to the z-domain $$Ai(z)z^{-1} + i_o(z)z^{-1} = i_o(z)$$
$$H(z) = \frac{i_o(z)}{i(z)} = \frac{A \cdot z^{-1}}{1 - z^{-1}}$$

A bilinear Ideal Integrator can be implemented by providing the dotted connection from a further input 8 via a switch S4 to the node 2. Switch S1 is close during portion $\phi 1$ of each sampling period and input 1 receives an input current i while switch S4 is closed during portion $\phi 2$ of each sampling period and input 8 receives an input current $-i$. The operation of this integrator can be analysed as follows.

During portion $\phi 2$ of sampling period $(n-1)$ $$I_1 = 2j - i(n-1) - I_2$$
$$I_2 = I_3/A = j - i_o(n-1)/A$$
$$I_1 = j - i(n-1) + i_o(n-1)/A.$$

During portion $\phi 1$ of sampling period n $$\begin{aligned} I_2 &= 2j - i(n) - I_1 \\ &= j + i(n) + i(n-1) - i_o(n-1)/A \\ &= I_3/A \\ &= j - i_o(n)/A \end{aligned}$$

Therefore
$$i_o(n)/A = -i(n) - i(n-1) + i_o(n-1)/A$$
$$i_o(n) - i_o(n-1) = -A[i(n) + i(n-1)]$$

Transforming to the z domain $$i_o(z)(1 - z^{-1}) = -A[i(z)(1 + z^{-1})]$$
$$H(z) = \frac{i_o(z)}{i(z)} = -A \cdot \frac{1 + z^{-1}}{1 - z^{-1}}$$

A feedforward input can be added to the integrator as disclosed in our co-pending U.S. Pat. No. 5,059,832 (Oct. 22, 1991). This is achieved by providing the dotted connection between a further input 9 and the mode 2.

The operation of the circuit with the feedforward input analysed when performing the Backward Euler mapping, that is with switch S1 closed during the portion $\phi 1$ of each sampling period, can be as follows.

It is assumed that an input current $i_1$ is applied to input 1 and an input current $i_2$ is applied to input 9.

During the portion $\phi 2$ of sampling period $(n-1)$ $$I_1 = 2j + i_2(n-1) - I_2 \text{ and}$$

$$I_2 = I_3/A = j - i_o(n-1)/A$$

Therefore,
$$I_1 j + i_2(n-1) + i_o(n-1)/A$$

During the portion $\phi 1$ of sampling period n $$\begin{aligned} I_2 &= i_1(n) + i_2(n) + 2j - I_1 \\ &= I_3/A = j - i_o(n)/A \end{aligned}$$

$$j - i_o(n)/A = 2j + i_1(n) + i_2(n) - j - i_2(n-1) - i_o(n-1)/A$$
$$i_o(n) - i_o(n-1) = A[i_2(n) - i_2(n-1) + i_1(n)].$$

Transforming to the z domain $$i_o(z)(1 - z^{-1}) = -Ai_1(z) - Ai_2(z)(1 - z^{-1})$$

$$i_o(z) = -\frac{Ai_1(z)}{1 - z^{-1}} - Ai_2(z)$$

This corresponds to a Backward Euler Ideal Integration of input current $i_1$ and a feedforward, with scaling and signal inversion, of the input current $i_2$.

It will be apparent that more than one feedforward input may provided so that signals from a plurality of sources may be feedforward through the integrator circuit. Similarly, a plurality of switched inputs may be provided so that signals from a plurality of sources may be simultaneously integrated. This can be such that the integrator acts as a bilinear integrator for one or more signal sources while simultaneously acting as a Forward Euler Integrator for other signals and for a Backward Euler Integrator for yet other signals. The number of such simultaneously applied signals which can be handled will depend on the input impedance of the current memory cells and the output impedance of the signal sources.

Figure 3:
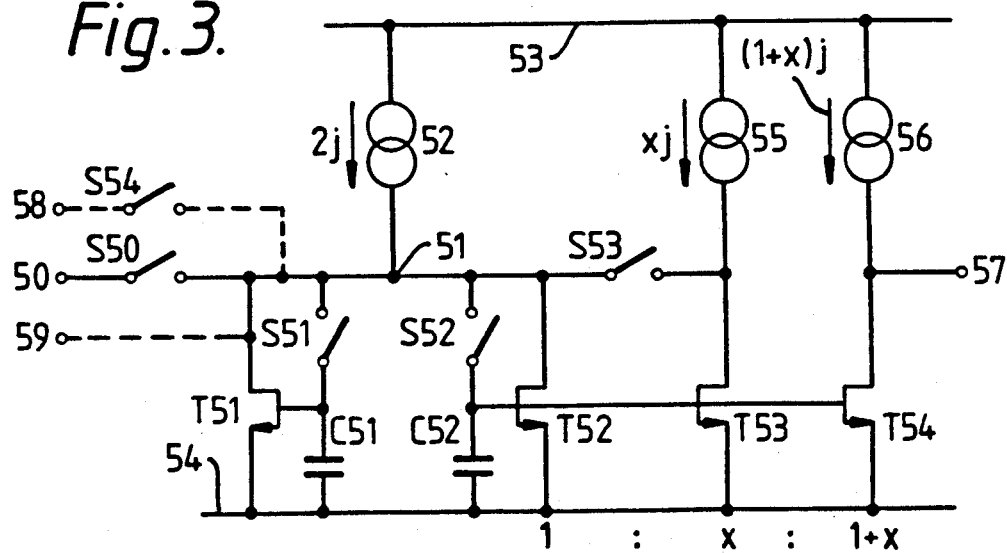
FIG. 3 is a circuit diagram of a second embodiment of an integrator circuit according to the invention.

FIG. 3 shows a Lossy Integrator. The circuit shown in FIG. 3 has an input 50 which is connected via a switch S50 to a node 51. A current source 52 is connected between the node 51 and a positive supply rail 53. Also connected to the node 51 are the drain electrodes of two n-channel field effect transistors T51 and T52 and one side of three switches S51, S52, and S53. The source electrodes of transistors T51 and T52 are connected to a negative supply rail 54. The other side of switch S51 is connected to the junction of the gate electrode of transistor T51 and a capacitor C51, while the other side of switch S52 is connected to the junction of the gate electrode of transistor T52 and a capacitor C52. The other ends of capacitors C51 and C52 are connected to the negative supply rail 54. A current source 55 is connected between the positive supply rail 53 and the junction of the other side of the switch S53 and the drain electrode of an n-channel field effect transistor T53 whose source electrode is connected to the negative supply rail 54. A current source 56 is connected between the positive supply rail 53 and the junction of an output terminal 57 and the drain electrode of an n-channel field effect transistor T54 whose source electrode is connected to the negative supply rail 54. The gate electrode of transistor T52 is connected to the gate electrodes of transistors T53 and T54.

The switches S52 and S53 are closed during the portion $\phi1$ of each sampling period, while the switches S50 and S51 are closed during the portion $\phi2$ of each sampling period. The current source 52 produces a current 2j, the current source 55 produces a current xj, and the current source 56 produces a current $(1+x)j$.

The transistor T53 has a channel width/length ratio of x times that of transistor T52 while transistor T54 has a channel width/length ratio of $(1+x)$ times that of transistor T52. It should be noted that it is not essential that the channel width/length ratio of transistor T54 be $(1+x)$ times that of transistor T52. That value merely simplifies the mathematics and thus any desired scaling factor could be used.

The operation of the circuit shown in FIG. 3 can be analysed as follows. During the portion $\phi2$ of sampling period $(n-1)$ the current $I_1$ through transistor T51 is given by the relationship $$I_1 = 2j - i(n-1) - I_2$$

Where $I_2$ is the current through transistor T52

$$\begin{aligned} I_1 &= 2j + i(n-1) - [(1-x)j - i_o(n-1)]/(1+x) \\ &= j + i(n-1) + i_o(n-1)/(1+x). \end{aligned}$$

During the portion $\phi1$ of sampling period n the current $I_4$ through transistor T54 is given by the relationship $$\begin{aligned} I_4 &= I_2 + I_3 \text{ where } I_3 \text{ is the current through transistor T53} \\ &= 2j - xj - I_1 \end{aligned}$$

$$\begin{aligned} i_o(n) &= (1+x)j - I_4 \\ &= (1+x)j - [2j - xj - j - i(n-1) - i_o(n-1)/(1+x)] \\ &= i(n-1) + i_o(n-1)/(1+x). \end{aligned}$$

Transforming to the z domain $$i_o(z) = i(z)z^{-1} + i_o(z)z^{-1}/(1+x)$$

$$i_o(z)[1 - z^{-1}/(1+z)] = i(z)z^{-1}$$

$$H(z) = i_o(z) = z^{-1}/[1 - z^{-1}/(1+x)].$$

This is a Forward Euler Lossy Integrator where the factor x is the loss term. It can easily be seen that when $x = o$ an ideal integrator is formed.

i.e. $H(z) = z^{-1}/(1-z^{-1})$

A Backward Euler Lossy Integrator may be constructed merely by closing the switch S50 during the portion $\phi1$ of each sampling period rather than during the portion $\phi2$. A Bilinear Lossy Integrator may be formed by providing a second switched input 58 which is connected via a switch S54 to the node 51. Switch S50 is closed during the portion $\phi1$ of each sampling period and input 50 receives a current i while switch S54 is closed during the portion $\phi2$ of each sampling period and input 58 receives the current $-i$.

An analysis of the circuit shown in FIG. 3 when configured to provide a Backward Euler Lossy Integrator or a Bilinear Lossy Integrator may be performed in like manner to the analysis of the Forward Euler Lossy Integrator. In addition, if the input 59 is connected directly to the node 51, as shown dotted in FIG. 3, then a feedforward facility is added to the integrator.

Figure 4:
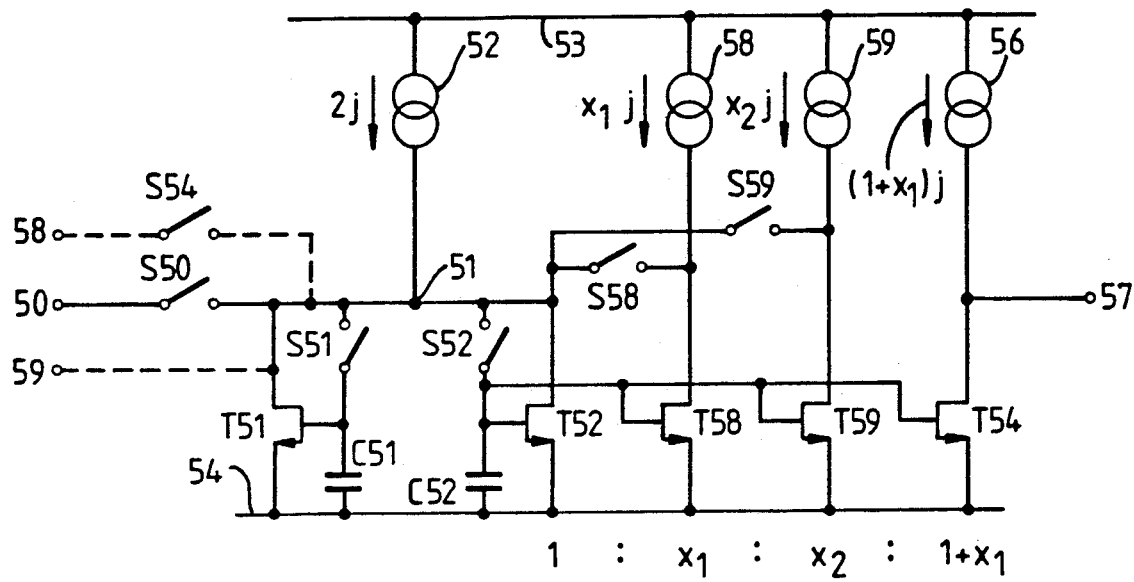
FIG. 4 is a circuit diagram of a third embodiment of an integrator circuit according to the invention.

When $x << 1$ then a high Q circuit is formed but x tends not to be very well defined due to edge errors in transistor dimensions. This can be improved by defining x as the difference between two values enabling the edge errors to be reduced by cancellation. The circuit shown in FIG. 4 illustrates how this may be achieved. Components in FIG. 4 have been given the same reference symbols as equivalent components in FIG. 3. It can be seen that FIG. 4 differs from FIG. 3 in that two switches S58 and S59 are connected to the node 51 instead of the switch S53. The other side of switch S58 is connected to the junction of a current source 58 and the drain electrode of an n-channel field effect transistor T58 whose source electrode is connected to the negative supply rail 54. The other side of switch S59 is connected to the junction of a current source 59 and the drain electrode of an n-channel field effect transistor T59 whose source electrode is connected to the negative supply rail 54. The gate electrode of transistors T58 and T59 are connected to the gate electrode of transistor T52. The other sides of the current sources 58 and 59 are connected to the positive supply rail 53. It will be seen that current sources 58 and 59, switches S58 and S59, and transistors T58 and T59 replace the switch S53, current source 55, and transistor T53. The current sources 58 and 59 produce the currents $x_1j$ and $x_2j$ respectively. The transistors T58 and T59 are dimensioned so that they conduct $x_1$ and $x_2$ times respectively the current conducted by transistor T52. The current source 56 produces the current $(1+x_1)j$ while transistor T54 is dimensioned to produce a current $(1+x_1)$ times that produced by transistor T52. Switches S50, S51 and S59 are closed during the portion $\phi2$ of each sampling period while switches S52 and S58 are closed during the portion $\phi1$ of each sampling period.

The operation of the circuit shown in FIG. 4 may be analysed as follows. During the portion $\phi2$ of sampling period $(n-1)$ the current $I_1$ through transistor T51 is given by the relationship $$I_1 = 2j + i(n-1) - I_2 + x_2j - I_9$$

where $I_2$ is the current through transistor T52 and $I_9$ is the current through transistor T59.

$$\begin{aligned} I_2 &= I_4/(1+x_1) \\ &\quad \text{where } I_4 \text{ is the current through transistor T54} \\ &= j - i_o(n-1)/(1+x_1) \\ &= I_9/x_2 \end{aligned}$$

Therefore $$\begin{aligned} I_1 &= 2j + i(n-1) - [j - i_o(n-1)/(1+x_1)] + x_2j - [j - i_o(n-1)/(1+x_1)]x_2 \\ &= j + i_o(n-1)(1+x_2)/(1+x_1) + i(n-1) \end{aligned}$$

During portion $\phi1$ of sampling period n $$I_4 = I_2 - I_8$$

where $I_8$ is the current through transistor T58

$$= 2j + x_1j - I_1$$
$$= (1 - x_1)j - [i(n-1) + i_o(n-1)(1 + x_2)/(1 - x_1)]$$

$$i_o(n) = (1 + x_1)j - I_4$$
$$= i(n-1) + i_o(n-1)(1 + x_2)/(1 + x_1)$$

Transforming to the z domain $$i_o(z) = i(z)z^{-1} + i_o(z)z^{-1}(1 + x_2)(1 + x_1)$$

$$H(z) = z^{-1}/[1 - z^{-1}(1 + x_2)/(1 + x_1)]$$
$$\simeq z^{-1}/[1 - (1 - (x_1 - x_2))z^{-1}]$$

Consequently, assuming the $x_1 << 1$ and $x_2 << 1$, the loss term $\simeq x_1 - x_2$ A similar analysis may be performed for the Backward Euler and Bilinear Integrators and for the addition of one or more feedforward inputs.

Figure 5:
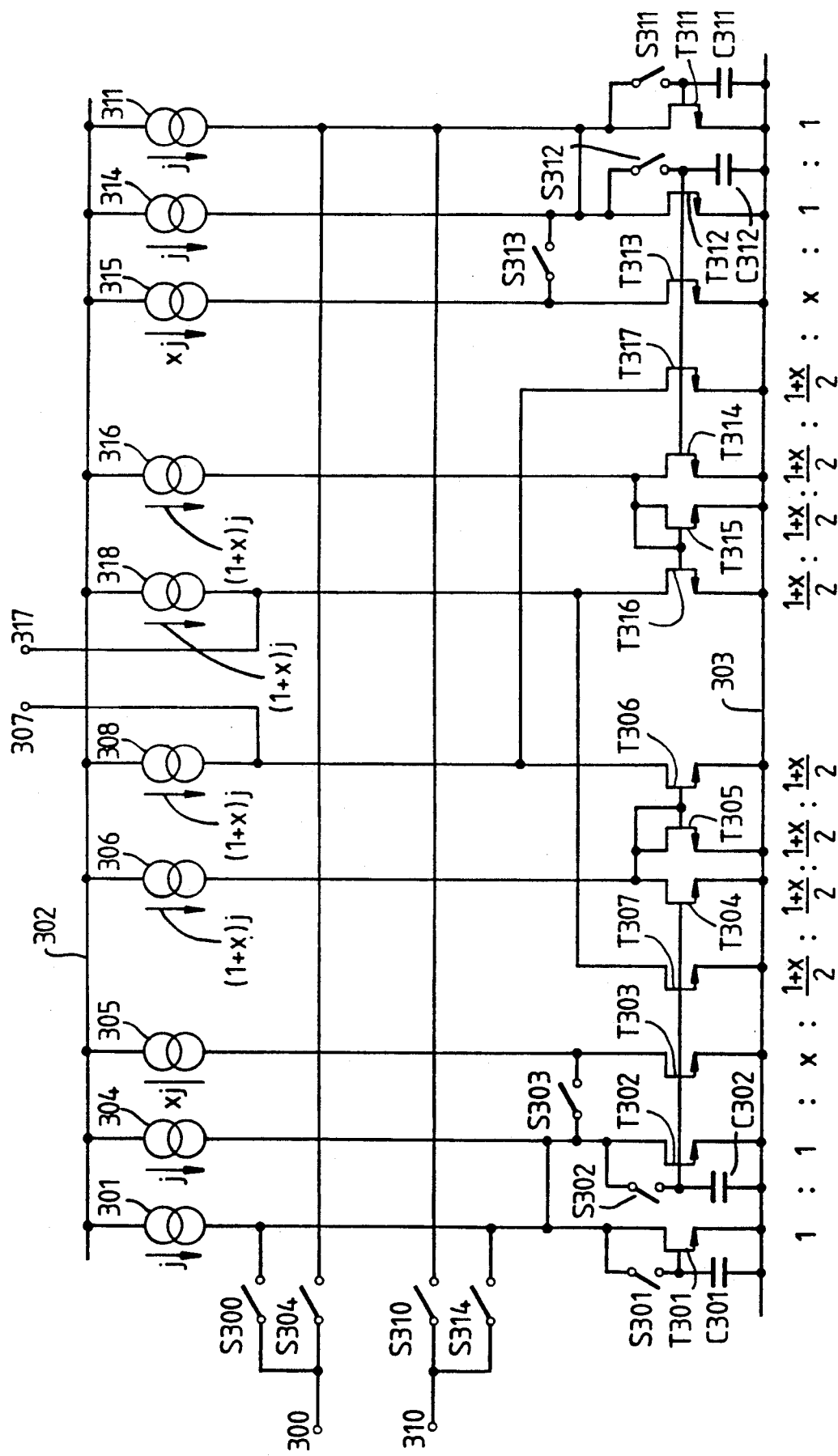
FIG. 5 is a circuit diagram of a fourth embodiment of an integrator circuit according to the invention.

FIG. 5 shows a fully differential Bi-linear Lossy Integrator according to the invention. The integrator shown in FIG. 5 has a first input 300 which is connected via a switch S300 to the junction of a current source 301 whose other end is connected to a positive supply rail 302 and the drain electrode of an n-channel field effect transistor T301 whose source electrode is connected to a negative supply rail 303. A switch S301 is connected between the drain and gate electrodes of transistor T301 while a capacitor C301 is connected between its gate and source electrodes. A current source 304 is connected between the positive supply 302 and the drain electrode of an n-channel field effect transistor T302 whose source electrode is connected to the negative supply rail 303. A switch S302 is connected between the drain and gate electrodes of transistor T302 while a capacitor C302 is connected between its gate and source electrodes. The drain electrode of transistor T302 is connected to the drain electrode of transistor T301 and via a switch S303 to the drain electrode of an n-channel field effect transistor T303 whose source electrode is connected to the negative supply rail 303. A current source 305 is connected between the drain electrode of transistor T303 and the positive supply rail 302.

A current source 306 is connected between the positive supply rail 302 and the drain electrodes of two n-channel field effect transistors T304 and T305 whose source electrodes are connected to the negative supply rail 303. The drain electrode of transistor T305 is connected to its gate electrode and to the gate electrode of an n-channel field effect transistor T306. The source electrode of transistor T306 is connected to the negative supply rail 303 while its drain electrode is connected to an output terminal 307 and via a current source 308 to the positive supply rail 302. The gate electrode of transistor T302 is connected to the gate electrodes of transistors T303 and T304.

A second input 310 is connected via a switch S310 to the junction of a current source 311 and the drain electrode of an n-channel field effect transistor T311. The other end of the current source 311 is connected in the positive supply rail 302 while the source electrode of transistor T311 is connected to the negative supply rail 303. A switch S311 is connected between the drain and gate electrodes of transistor T311 while a capacitor C311 is connected between its gate and source electrodes. The drain electrode of transistor T311 is connected to the junction of a current source 314 and the drain electrode of an n-channel field effect transistor T312. The other end of the current source 314 is connected to the positive supply rail 302 while the source electrode of transistor T312 is connected to the negative supply rail 303. A switch S312 is connected between the drain and gate electrodes of transistor T312 while a capacitor C312 is connected between its gate and source electrodes.

The drain electrode of transistor T312 is connected via a switch S313 to the junction of a current source 315 and the drain electrode of an n-channel field effect transistor T313. The other end of the current source 315 is connected to the positive supply rail 302 while the source electrode of transistor T313 is connected to the negative supply rail 303. A current source 316 is connected between the positive supply rail 302 and the drain electrodes of two n-channel field effect transistors T314 and T315, whose source electrodes are connected to the negative supply rail 303. The drain electrode of transistor T315 is connected to its gate electrode and to the gate electrode of an n-channel field effect transistor T316. The source electrode of transistor T316 is connected to the negative supply rail 303 while its drain electrode is connected to an output terminal 317 and via a current source 318 to the positive supply rail 302. The gate electrode of transistor T312 is connected to the gate electrodes of transistors T313 and T314.

The drain electrode of transistor T306 is connected to the drain electrode of an n-channel field effect transistor T317 whose source electrode is connected to the negative supply rail 303 and whose gate electrode is connected to the gate electrode of transistor T312. The drain electrode of transistor T316 is connected to the drain electrode of an n-channel field effect transistor T307 whose source electrode connected to the negative supply rail 303 and whose gate electrode is connected to the gate electrode of transistor 302. The input 300 is further connected via a switch S304 to the junction of the current source 311 and the drain electrode of transistor T311, while the input 310 is further connected via switch S314 to the junction of the current source 301 and the drain electrode of transistor T301.

The current sources 301, 304, 311, and 314 are arranged to produce a current j, the current sources 305 and 315 are arranged to produce a current xj, and the current sources 306, 308, 316 and 318 are arranged to produce a current j (1+x). The current mirror formed by transistors T302, T303, T307 and T304 is arranged to have current ratios of $1:x:(1+x)/2:(1+x)/2$. The current mirror formed by transistors T305 and T306 is arranged to have a current ratio of 1:1. The current mirror formed by transistors T312, T313, T317 and T314 and is arranged to have current ratios of $1:x:(1+x)/2:(1+x)/2$. The current mirror formed by transistors T315 and T316 is arranged to have a current ratio of 1:1.

Switches S300, S302, S303, S310, S312 and S313 are closed during the portion $\phi 1$ of each sampling period (see FIG. 2) while switches S301, S304, S311 and S314 are closed during the portion $\phi 2$ of each sampling period.

It can be seen that FIG. 5 basically comprises two interconnected bilinear integrators each being substantially of the form shown in FIG. 3. The scaling of the transistors T304, T307, T314, T317 is (1+x)/2 since the outputs of each integrators is summed to give the differential outputs. Also, an additional current mirror is required in each integrator to obtain the correct signs for the currents to be summed.

Figure 6:
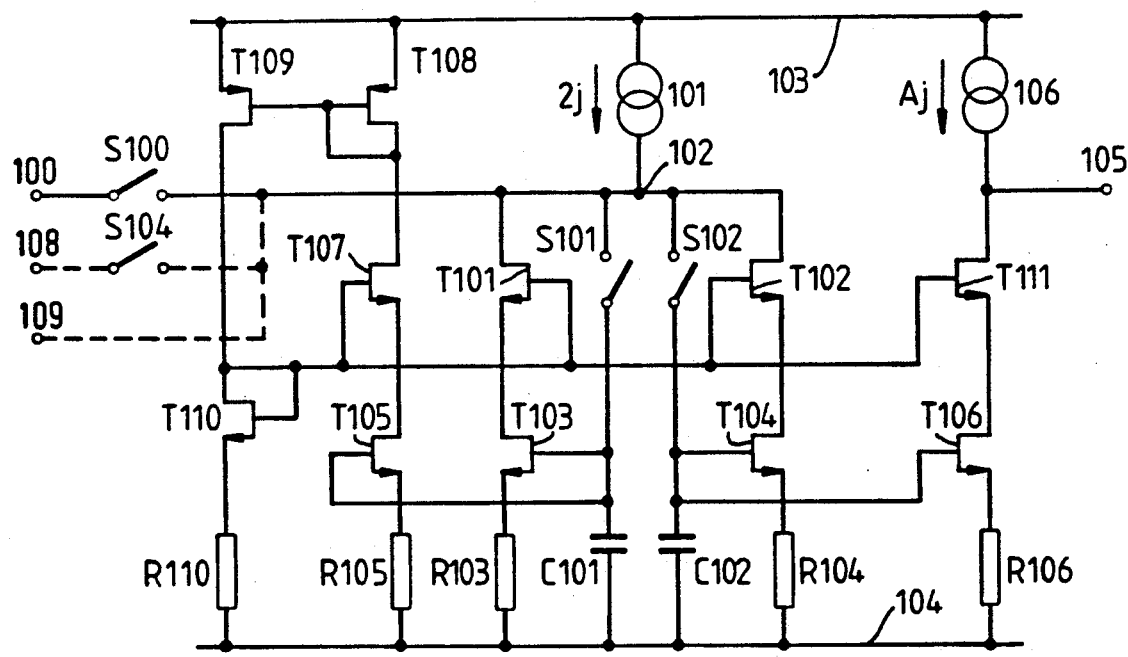
FIG. 6 is a circuit diagram of a fifth embodiment of an integrator according to the invention.

FIG. 6 shows an ideal integrator of the form shown in FIG. 1 in which the current memory cells are formed with cascade connected transistors to give a higher output impedance. As shown in FIG. 6, the integrator has an input 100 which is connected via a switch S100 to a node 102. A current source 101 is connected between the node 102 and a positive supply rail 103. The node 102 is further connected to the drain electrodes to two n-channel field effect transistors T101 and T102 and to one side of two switches S101 and S102. The source electrodes of transistors T101 and T102 are connected to the drain electrodes of two further n-channel field effect transistors T103 and T104 respectively. The other side of switch S101 is connected to the junction of the gate electrode of transistor T103 and a capacitor C101 while the other side of switch S102 is connected to the junction of the gate electrode of transistor T104 and a capacitor C102. The other ends of capacitors C101 and C102 are connected to a negative supply rail 104. The gate electrode of transistor T103 is connected to the gate electrode of an n-channel field effect transistor T105 while the gate electrode of transistor T104 is connected to the gate electrode of an n-channel field effect transistor T106. The drain electrode of transistor T105 is connected to the source electrode of an n-channel field effect transistor T107 whose drain electrode is connected to the drain and gate electrode of a p-channel field effect transistor T108. The gate electrode of transistor T108 is connected to the gate electrode of a p-channel field effect transistor T109 whose source electrode is connected to the positive supply rail 103 and whose drain electrode is connected to the drain and gate electrodes of an n-channel field effect transistor T110. The drain electrode of transistor T106 is connected to the source electrode of an n-channel field effect transistor T111 whose drain electrode is connected to an output 105 and via a current source 106 to the positive supply rail 103. The source electrode of transistor T108 is connected to the positive supply rail 103. The gate electrode of transistor T110 is connected to the gate electrodes of transistors T101, T102, T107 and T111. The source electrodes of transistors T103, T104, T105, T106 and T110 are connected to the negative supply rail 104 via resistors R103, R104, R105, R106 and R110 respectively.

The circuit shown in FIG. 6 is in essence the same as that shown in FIG. 1 with each of the current memory cells formed with cascoded transistors to increase the output impedance, particularly of the mirror devices in the second current memory cell connected to the output of the integrator. In addition, source degeneration resistors have been included to improve the matching between the branches of the current mirror circuits. Transistors T105, T107, T108, T109 and T110 and resistors R105 and R110 form a bias voltage generating arrangement for the cascode connected transistors which operates as described in U.S. Pat. No. 4,897,596 (1/30/90), to which reference should be made for a description of the operation of the bias voltage generating arrangement. For best performance each of the two current memory cells should be provided with an individual bias voltage generating arrangement. This ensures that the bias voltage is maintained at the appropriate value for the current in the individual current memory cell. This is because the two current memory cells will normally be operating with significantly different currents and if a single bias source is provided the bias voltage for the cascode transistors has to be of the right value to ensure that the transistor carrying the greatest current remains saturated. Clearly, any or all of the current memory cells in the circuits shown herein may be replaced by current memory cells as shown in FIG. 6 with or without source degeneration resistors and with a common or individual bias voltage generating circuit which may take forms other than that shown in FIG. 6, for example, as mentioned in the introduction to our the aforesaid U.S. Pat. No. 4,897,596.

The integrator shown in FIG. 6 may be constructed as a bilinear integrator by providing an input 108 and a switch S104 (shown dotted) as with the arrangement shown in FIG. 1. Similarly, a feedforward facility can be added by provided the input 109 (shown dotted) connected to the node 102.

Figure 7:
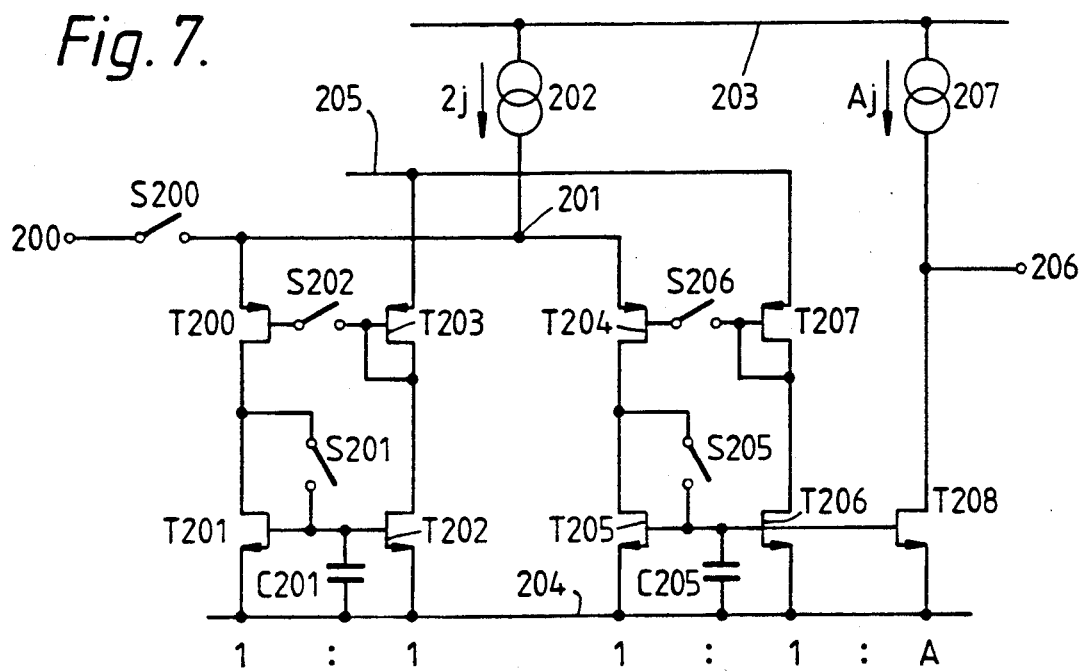
FIG. 7 is a circuit diagram of a sixth embodiment of an integrator according to the invention.

FIG. 7 shows an ideal integrator which is generally of the form shown in FIG. 1 where the current memory cells are constructed using modified current conveyor circuits. The integrator shown in FIG. 7 has an input 200 which is connected via a switch S200 to a node 201. A current source 202 is connected between a positive supply rail 203 and the node 201. Also connected to the node 201 are the source electrodes of two p-channel field effect transistors T200 and T204. The drain electrode of transistor T200 is connected to the drain electrode of an n-channel field effect transistor T201 and to one side of a switch S201. The other side of the switch S201 is connected to the gate electrode of transistor T201, to the gate electrode of an n-channel field effect transistor T202, and to one end of a capacitor C201 whose other end is connected to a negative supply rail 204. The drain electrode of transistor T202 is connected to the drain and gate electrodes of a p-channel field effect transistor T203 whose source electrode is connected to a bias voltage rail 205. The gate electrode of transistor T203 is connected via a switch S202 to the gate electrode of transistor T200. The source electrodes of transistors T201 and T202 are connected to the negative supply rail 204. Transistors T200 to T203, switches S201 and S202, and capacitor C201 form a first current memory cell in the form of a modified current conveyor circuit.

The drain electrode of transistor T204 is connected to the drain electrode of an n-channel field effect transistor T205 and to one side of a switch S205. The other side of switch S205 is connected to the gate electrode of transistor T205, to the gate electrode of an n-channel field effect transistor T206, and to one end of a capacitor C205 whose other end is connected to the negative supply rail 204. The drain electrode of transistor T206 is connected to the drain and gate electrodes of a p-channel field effect transistor T207 whose source electrode is connected to the bias voltage rail 205. The gate electrode of transistor T207 is connected via a switch S206 to the gate electrode of transistor T204. The source electrodes of transistors T205 and T206 are connected to the negative supply rail 204. Transistors T204 and T207, switches S205 and S206, and capacitor C205 form a second current memory cell of the same form as the first current memory cell.

The gate electrode of transistor T206 is connected to the gate electrode of an n-channel field effect transistor T208 whose source electrode is connected to the negative supply rail 204. The drain electrode of transistor T208 is connected to an output terminal 206 and via a current source 207 to the positive supply rail 203. Transistor T208 forms a second output of the second current memory cell and may be dimensioned relative to transistors T205 and T206 to give a desired gain factor for the integrator.

The operation of the circuit shown in FIG. 7 is basically the same as that of the circuit shown in FIG. 1. Forming the current memory cells from modified current conveyor circuits gives a very low (nominally zero) input impedance for the current memory cell when the switches S201 and S202 (or S205 and S206) are closed. This is of particular advantage when a plurality of currents are being summed into the input of the current memory cell as occurs at the node 201. This is even more marked when a lossy integrator such as those shown in FIGS. 3 and 4 are constructed, where several current sources are summing into the input of a current memory cell.

Figure 8:
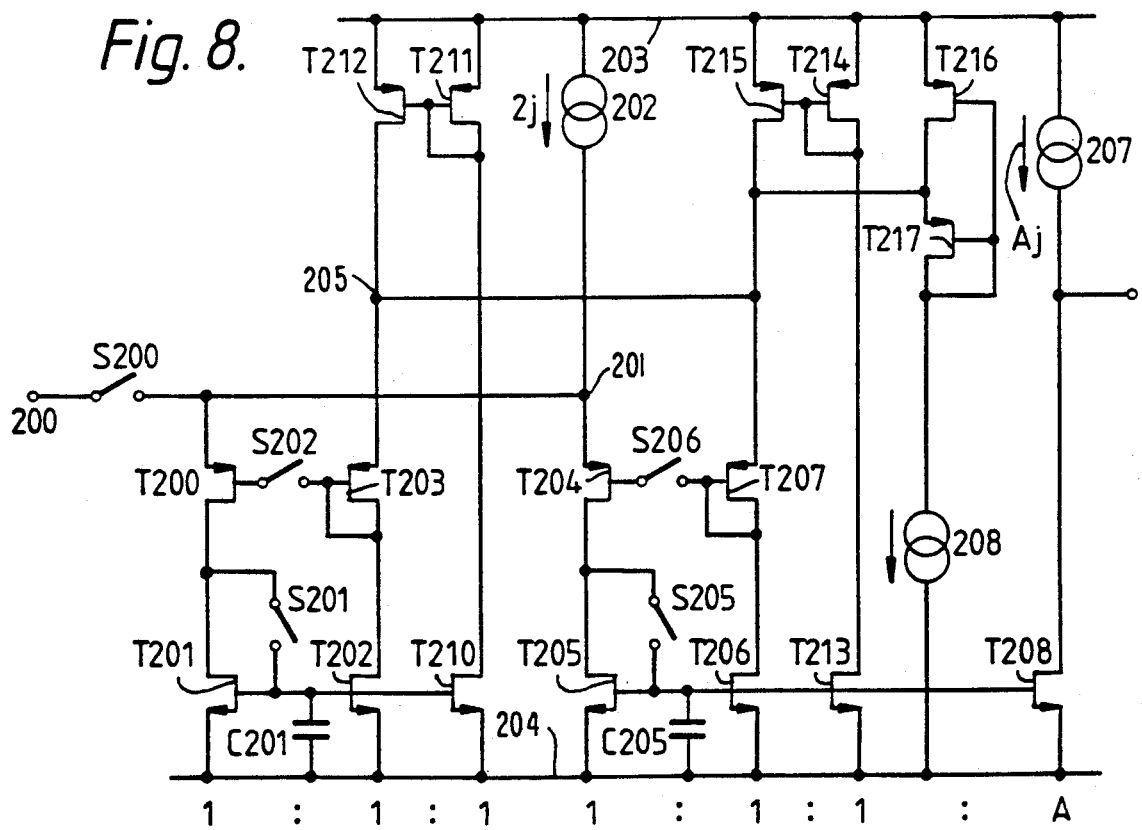
FIG. 8 is a circuit diagram of a seventh embodiment of an integrator according to the invention.

FIG. 8 shows a modification of FIG. 7 where Class II current conveyors are employed rather than Class I current conveyors. As disclosed in U.S. Pat. No. 5,055,719 (Oct. 8, 1991), the current conveyor is a three port network whose ports can be denoted x, y and z. Its terminal characteristics can be represented by a hybrid matrix giving the outputs of the three ports in terms of their corresponding inputs. For a class I current conveyor this relationship is:

$$\begin{pmatrix} i_y \\ v_x \\ i_z \end{pmatrix} = \begin{pmatrix} 0 & 1 & 0 \\ 1 & 0 & 0 \\ 0 & -1 & 0 \end{pmatrix} \begin{pmatrix} v_y \\ i_x \\ v_z \end{pmatrix}$$

For a class II current conveyor this relationship is:

$$\begin{pmatrix} i_y \\ v_x \\ i_z \end{pmatrix} = \begin{pmatrix} 0 & 0 & 0 \\ 1 & 0 & 0 \\ 0 & -1 & 0 \end{pmatrix} \begin{pmatrix} v_y \\ i_x \\ v_z \end{pmatrix}$$

Further information concerning current conveyors and their implementation can be obtained by reference to the paper entitled "Current Conveyors: A Review of the State of the Art" by Umesh Kumar, published in IEEE Circuits and Systems Magazine, Vol. 3, No. 1, 1981, pages 10 to 14 and in the references cited therein. As discussed in that publication, the transfer characteristic between ports x and z is that of a current controlled current source with a virtual short circuit at input x. The output impedance at port z can be made very high by techniques such as cascoding, thus giving a large difference between input and output impedances. The very low (virtual short circuit) input impedance allows accurate current summing when the input to the current conveyor forms the summing node. Additional information on the use of current conveyors in switched current signal processing circuit arrangements can be found in U.S. Pat. Nos. 5,055,719 (Oct. 8, 1991) and 5,028,822 (Jul. 2, 1991).

FIG. 8 shows an ideal integrator of the general form of that shown in FIG. 1 where the current memory cells are constructed as modified class II current conveyors which are substantially as shown in U.S. Pat. No. 5,055,719. In FIG. 8, components corresponding to those in FIG. 7 have been given the same reference signs and the only additions to the circuit shown in FIG. 7 will now be described. The gate electrode of transistor T202 is additionally connected to the gate electrode of an n-channel field effect transistor T210 whose source electrode is connected to the negative supply rail 204 and whose drain electrode is connected to the drain electrode of a p-channel field effect transistor T211. The gate electrode of transistor T211 is connected to its drain electrode and to the gate electrode of a p-channel field effect transistor T212. The source electrodes of transistors T211 and T212 are connected to the positive supply rail 203 while the drain electrode of transistor T212 is connected to the source electrode of transistor T203 and to the bias voltage rail 205.

The gate electrode of transistor T206 is connected to the gate electrode of an n-channel field effect transistor T213 whose source electrode is connected to the negative supply rail 204 and whose drain electrode is connected to the drain electrode of a p-channel field effect transistor T214. The gate electrode of transistor T214 is connected to its drain electrode and to the gate electrode of a p-channel field effect transistor T215. The source electrodes of transistors T214 and T215 are connected to the positive supply rail while the drain electrode of transistor T215 is connected to the drain electrode of transistor T207. The drain electrode of transistor T215 is connected to the drain electrode of a p-channel field effect transistor T216, to the source electrode of a p-channel field effect transistor T217, and to the bias voltage rail 205. The gate electrode of transistor T216 is connected to the gate and drain electrode of transistor T217. The drain electrode of transistor T217 is connected to the negative supply rail 204 via a current source 208, while the source electrode of transistor T216 is connected to the positive supply rail 203.

When switches S201 and S202 are closed, transistors T200 to T203 and T210 to T212 form a class II current conveyor as disclosed in U.S. Pat. No. 5,055,719 and consequently provides a very low impedance to currents summing at the node 201. When switches S201 and S202 are open, then transistors T201 and T200 form a current source producing a current dependent on the charge stored in capacitor C201 when switches S201 and S202 were closed. Similarly, when switches S205 and S206 are closed, transistors T204 to T207 and T213 to T215 form a class II current conveyor. The arrangement of transistors T216 and T217 and current source 208 provide a bias voltage generator for the Y input of the current conveyor circuits. In order to give maximum signal handling capacity the bias voltage rail 205 should be held at $V_{dss}$ below the positive supply rail and this is achieved by making the channel width/length ratio of transistor T216 one third of that of transistor T217. The switches S201 and S202 are closed during one portion $\phi 1$ ($\phi 2$) of each sampling period while the switches S205 and S206 are closed during a second portion $\phi 2$ ($\phi 1$) of each sampling period. Clearly, the timing of the switches will determine whether Backward or Forward Euler Integrators are formed.

Figure 9:
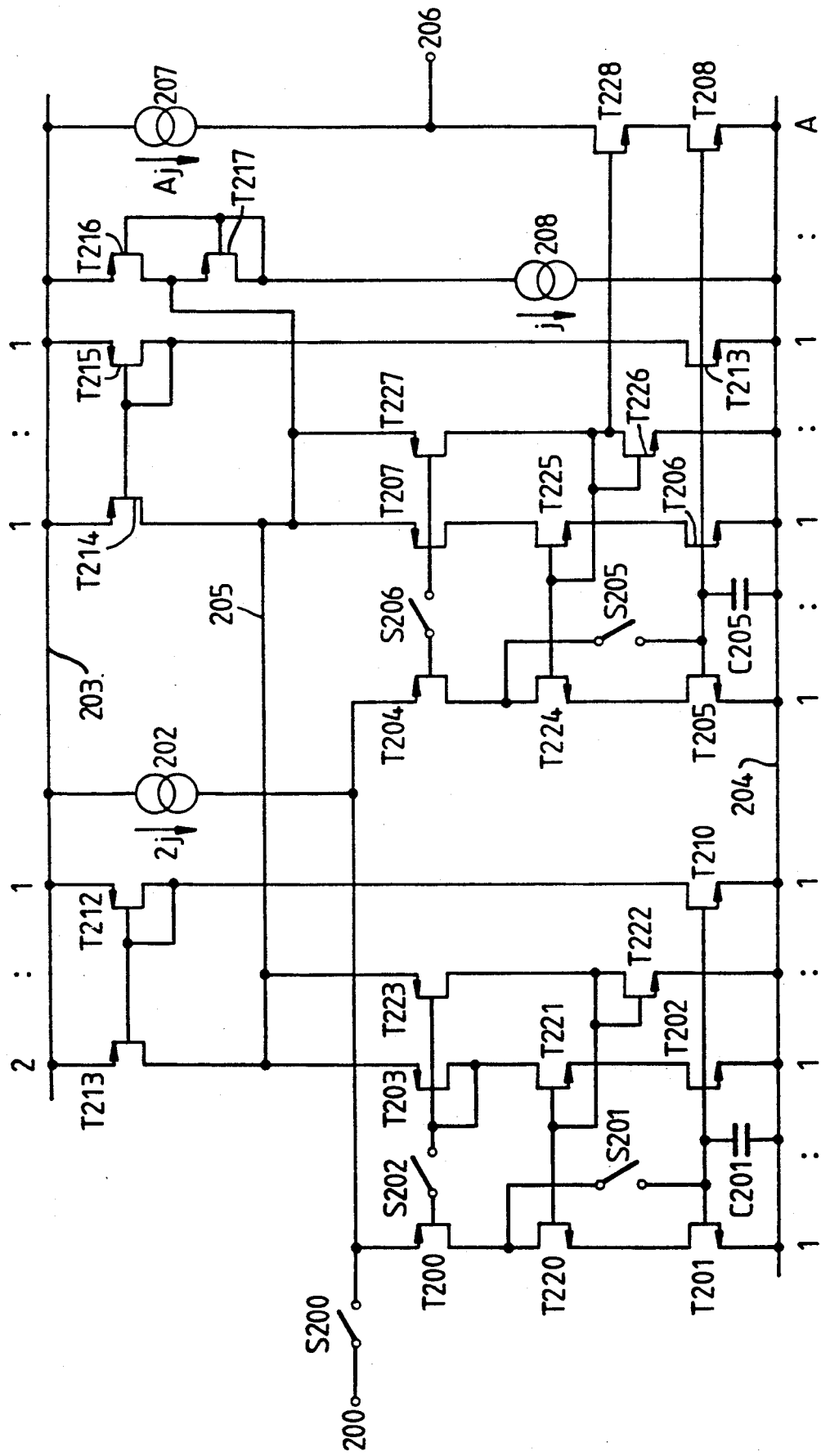
FIG. 9 is a circuit diagram of an eighth embodiment of an integrator a according to the invention.

FIG. 9 shows an integrator using class II current conveyors which have cascode connected transistors to increase the output impedance at port x when the switches S201 and S202 (or S205 and S206) are open. Again, only the additions to the circuit shown in FIG. 8 will be described. An n-channel field effect transistor T220 has its drain electrode connected to the junction of the drain electrode of transistor T200 and switch S201 and its source electrode connected to the drain electrode of transistor T201. A further n-channel field effect transistor T221 has its drain electrode connected to the drain electrode of transistor T203 and its source electrode connected to the drain electrode of transistor T202. The gate electrode of transistor T220 is connected to the gate electrode of transistor T221 and to the gate electrode of an n-channel field effect transistor T222 whose source electrode is connected to the negative supply rail 204. The gate electrode of transistor T222 is connected to its drain electrode and to the drain electrode of a p-channel field effect transistor T223 whose source electrode is connected to the bias voltage rail 205 and whose gate electrode is connected to the gate electrode of transistor T203.

An n-channel field effect transistor T224 has its drain electrode connected to the junction of the drain electrode of transistor T204 and switch S205 and its source electrode connected to the drain electrode of transistor T205. A further n-channel field effect transistor T225 has its drain electrode connected to the drain electrode of transistor T207 and its source electrode connected to the drain electrode of transistor T206. The gate electrode of transistor T224 is connected to the gate electrode of transistor T225, to the gate electrode of an n-channel field effect transistor T228, and to the gate electrode of an n-channel field effect transistor T226 whose source electrode is connected to the negative supply rail 204. The gate electrode of transistor T226 is connected to its drain electrode and to the drain electrode of a p-channel field effect transistor T227. The source electrode of transistor T227 is connected to the bias voltage rail 205 while its gate electrode is connected to the gate electrode of transistor T207. The drain electrode of transistor T208 is connected to the source electrode of transistor T228 while the drain electrode of transistor T228 is connected to the junction of the output 206 and the current source 207.

The current conveyor type current memory cell may be arranged such that the channel width/length ratios of transistors T202, of transistors T220 and T221, and of transistors T200 and T203 are all 1:1. In that case the channel width/length ratio of transistor T223 is the same as that of transistor T203 while that of transistor T222 is a quarter of that of transistors T201 and T202. Consequently, when the switches S201 and S202 are closed the current through the branch formed by transistors T222 and T223 is equal to the input current through the input branch formed by transistors T200, T220 and T201. As a result a voltage of $V_T + 2V_{dss}$ is produced at the gate electrodes of the cascode transistors T220 and T221. When switches S201 and S202 open, the input branch becomes a current source which, because of the cascode connection has a high output impedance and the transistor T220 has the optimum bias voltage applied to its gate electrode as it is dependent on the current applied when switches S201 and S202 are closed since the input current will be maintained in transistor T223 due to the charge stored on capacitor C201. It should be noted that transistor T221 may be omitted as any imbalance in the mirroring of currents into transistor T203 will only result in an offset in the voltage at the x input (source electrode of transistor T200).

It should be noted that the current conveyor could be arranged to have different currents in the two branches, that is the channel width/length ratios of transistors T201, and T202 of transistors T220 and T221, and of transistors T200 and T203 could all be A:1. This has the advantage that the current in the branch comprising T202, T221, and T203 can be less than the stored current, thus reducing the total current consumption of the circuit. In this case the channel width/length ratio of transistor T210 is made one quarter of that of transistor T201.

Similarly, transistor T223 may have a channel width/length ratio of B times that of transistor T200 and transistor T222 a channel width/length ratio of B/4 times that of transistor T201. In this case transistor T213 has a channel width/length ratio of (A+B) times that of transistor T212 to ensure no net current flows in line 205, thus maintaining the class II operation.

The switch S202 may be not be necessary if no further current conveyor circuit is connected to the node. If it is omitted then the memory cell will attempt to set the voltage at the x input to the bias voltage on rail 205 when it is acting as a current source. If a further current conveyor has its x input connected to the same node it will also try to set its own x input to the bias voltage on rail 205. If there is any offset between the two current conveyors then the potential at the source electrode of transistor T200 may not be precisely the same as that at the source electrode of transistor T203, leading to an error in the current produced at the x input. It should be noted that the first current memory cell is not provided with a z output except insofar as the x input may be considered to be equivalent to the z output when switches S201 and S202 are open. The second memory cell does not have a z output at the drain electrode of transistor T228 and also the quasi −z output at the x input when switches S205 and S206 are open.

Figure 10:
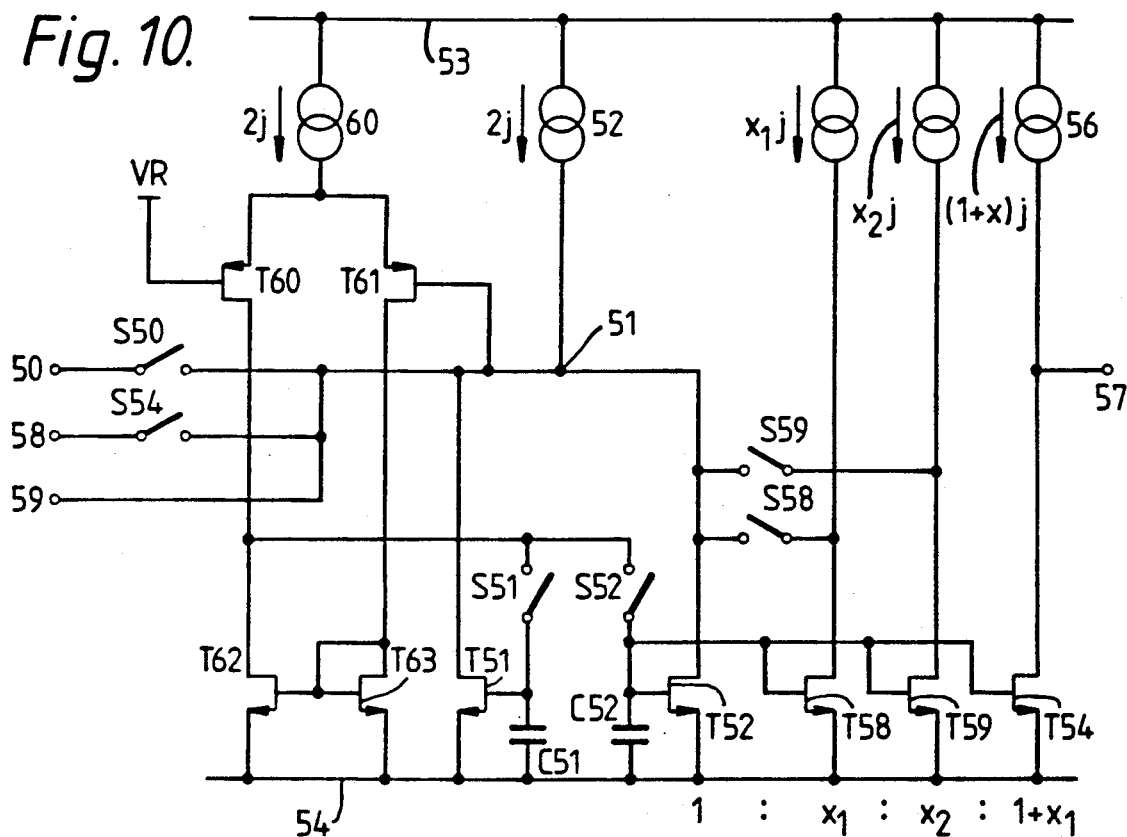
FIG. 10 is a circuit diagram of a ninth embodiment of an integrator according to the invention.

FIG. 10 shows an integrator of the same form as that shown in FIG. 4, but which has been modified to use as current memory cells a modified active current mirror. An active current mirror circuit has been disclosed in a communication to Electronics Letters, 13th October, 1988 by D. G. Nairn and C.A.T. Salama entitled "High Resolution Current-Mode A/D Converters using Active Current Mirrors".

In the circuit arrangement as shown in FIG. 10, elements having the same form and function as those shown in FIG. 4 have been given the same reference signs. The following description of FIG. 10 will mention only those features which are not present in the embodiment of FIG. 4. The circuit of FIG. 4 has been modified by the addition of a current source 60, two p-channel field effect transistors T60 and T61, and two n-channel field effect transistors T62 and T63 and by connecting one side of switches S51 and S52 to the junction of the drain electrodes of transistors T60 and T62 instead of to the node 51. The current source 60 is connected between the positive supply rail 53 and the junction of the source electrodes of transistors T60 and T61. The gate electrode of transistor T61 is connected to the node 51 while the gate electrode of transistor T60 is connected to a bias voltage source $V_R$. The drain electrode of transistor T61 is connected to the drain and gate electrodes of transistor T63 while the drain electrode of transistor T60 is connected to the drain electrode of transistor T62. The gate electrodes of transistors T62 and T63 are connected together while their source electrodes are connected to the negative supply rail 54. The current source 60 and transistors T60 and T63 form a differential amplifier having its non-inverting input connected to the node 51, its inverting input connected to a bias voltage source and its output connected to the junction of switches S51 and S52.

This arrangement causes the voltage at node 51 to be set close to $V_R$. Variation of the input current causes a variation of the gate-source potential of transistors T51 or T52, depending on whether S51 or S52 is closed, which results in only a small change in the voltage of node 51. The amplitude of this change and hence the input impedance of the current memory cell will depend on the gain of the differential amplifier and hence can be made very low. This modification can be made to any of the integrator circuits shown in FIGS. 1 to 5 and could be provided also with the cascade current memory cells illustrated in FIG. 6.

Figure 11:
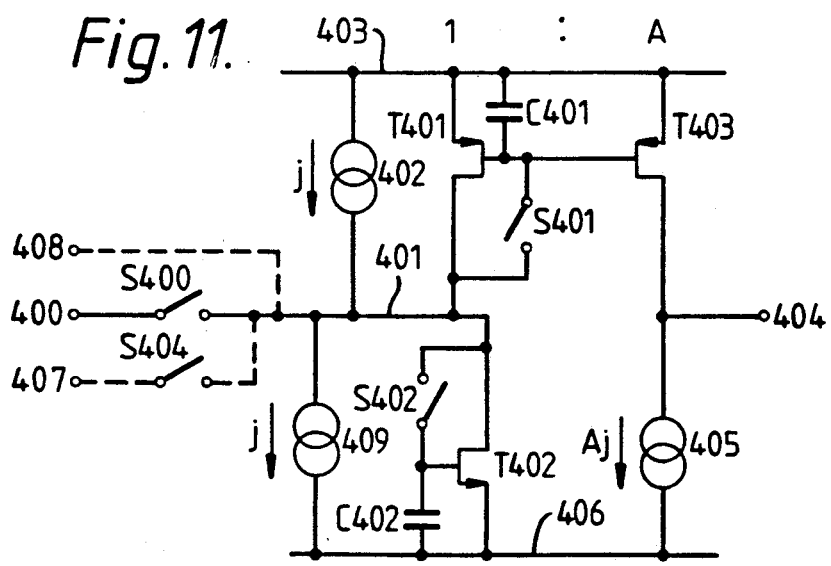
FIG. 11 is a circuit diagram of a tenth embodiment of an integrator according to the invention.

FIG. 11 shows an ideal integrator circuit in which a current memory cell using an n-channel field effect transistor is used in combination with a current memory cell using a p-channel field effect transistor.

As shown in FIG. 11, the integrator circuit has an input 400 which is connected via a switch S400 to a node 401. Also connected to the node 401 are one end of a first current source 402, one end of a second current source 409, one side of two further switches S401 and S402, and the drain electrodes of a p-channel field effect transistor T401 and an n-channel field effect transistor T402. The other end of the current source 402 is connected to a positive supply rail 403 while the other end of the current source 409 is connected to a negative supply rail 406. The gate electrode of transistor T401 is connected to the gate electrode of a further p-channel field effect transistor T403 and to the junction of the other side of switch S401 and one end of a capacitor C301 whose other end is connected to the positive supply rail 403. The source electrode of transistor T403 is connected to the positive supply rail 403 while its drain electrode is connected to an output 404 and via a current source 405 to the negative supply rail 406. The other side of the switch S402 is connected to the junction of the gate electrode of transistor T402 and a capacitor C402. The other end of the capacitor C402 and the source electrode of transistor T402 are connected to the negative supply rail 406.

The operation of the integrator shown in FIG. 11 can be analysed as follows. Switches S400 and S401 are closed in the portion $\phi 1$ of each sampling period and switch S401 is closed in the portion $\phi 2$ of each sampling period. The current sources 402 and 409 pass the current j while the current source 405 passes the current Aj. The channel width/length ratio of transistor T403 is A times that of transistor T401.

During the portion $\phi 2$ of a sampling period n−1 (see FIG. 2) the current $I_2$ through transistor T402 is given by the expression $$I_2 = I_1$$

where $I_1$ is the current through transistor T401

$$= I_3/A$$

where $I_3$ is the current through transistor T403

$$= [Aj + i_o(n - 1)]/A$$

$$= j + i_o(n - 1)/A$$

During portion $\phi 1$ of sampling period n $$I_1 = I_2 - i(n)$$

$$= j + i_o(n - 1)/A - i(n)$$

$$= j + i_o(n)/A$$

$$i_o(n)/A = i_o(n - 1)/A - i(n)$$

Transforming to z domain $$i_o(z)(1 - z^{-1}) = -Ai(z)$$

$$H(z) = \frac{i_o(z)}{i(z)} = \frac{A}{1 - z^{-1}}$$

Thus a Backward Euler mapping of an ideal integrator has been achieved.

A Forward Euler ideal integrator can be implemented by closing switches S400 and S402 during the portion $\phi 2$ and switch S401 during the portion $\phi 1$ of each sampling period. A bilinear integrator is implemented by providing the second dotted connection from a further input 407 via a switch S404 to the node 401. Switches S400 and S401 are closed during portion $\phi 1$ and switches S402 and S404 are closed during portion $\phi 2$ of each sampling period. An input current i is applied to input 400 while an input current −i is applied to input 407.

The analysis of the Forward Euler and Bilinear Integrators can be carried out in a similar manner to that performed with respect to the Backward Euler Integrator.

A feedforward input can be provided by connecting a further input 408 to the node 401, the connection being shown dotted in FIG. 11. The analysis of this circuit can be carried out in a similar manner to that performed with reference to FIG. 1.

Clearly, the integrator shown in FIG. 11 can be modified by replacing the basic current memory cells shown by those shown in any of FIGS. 6 to 10, which may be implemented using either polarity devices, and lossy integrators similar to those shown in FIGS. 3 and 4 can be produced. Further, fully differential versions equivalent to that shown in FIG. 5 could be produced.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any variation of one or more of those features which would be obvious to persons skilled in the art, whether or not it relates to the same invention as presently claimed in any claim and whether or not it mitigates any or all of the same technical problems as does the present invention.

I claim:

1. An integrator circuit comprising: an input for receiving an input signal in the form of a sampled analog current, an outupt at which, in operation, an integrated input signal is made available in the form of a sampled analog current, a first current memory cell having a memory device and an input connected to the input of the integrator circuit and an output connected to an input of a second current memory cell, the second current memory cell having a second memory device and a first output connected to the input of the first current memory cell and a second output connected to the output of the integrator circuit, wherein the output current of the first current memory cell is produced by the same device(s) that receives the input current to said first current memory cell and the output current at the first output of the second current memory cell is produced by the same device(s) that receives the input current of the second current memory cell.

2. An integrator circuit comprising: an input for receiving an input signal in the form of a sampled analog current, an output at which, in operation, an integrated input signal is made available in the form of a sampled analog current, a first current memory cell having an input connected to the input of the integrator circuit and an output connected to an input of a second current memory cell, the second current memory cell having a first output connected to the input of the first current memory cell and a second output connected to the output of the integrator circuit, wherein the output current of the first current memory cell is produced by the same device(s) that receives the input current and the output current at the first output of the second current memory cell is produced by the same device(s) that receives the input current, and wherein the integrator circuit input, the inputs of the first and second current memory cells, the output of the first current memory cell, the first output of the second current memory cell and a source of bias current are connected to a single node, the bias current enabling signals of both polarities to be integrated.

3. An integrator circuit as claimed in claim 2, wherein at least one of the first and second current memory cells comprise a MOS field effect transistor having a switch connected between its gate and drain electrodes, the input current being applied when the switch is closed and the output current being available when the switch is open, and means for controlling the operation of the switch by a clock signal synchronised with the sampling period of the input analog current.

4. An integrator circuit as claimed in claim 3, wherein a further capacitor, in addition to the MOS transistor inherent gate-source capacitance, is connected between the gate and source electrodes of the MOS transistor.

5. A integrator circuit as claimed in claim 3, wherein a cascode connected transistor is connected with its source-drain path between the drain electrode of the MOS transistor and the switch in one or both of the current memory cells.

6. An integrator circuit as claimed in claim 2, wherein the first and/or second current memory cell comprises a modified current conveyor circuit having its x-input connected to said single node, the circuit further comprising switching means synchronised with the sampling period of the input analog current for causing, when the switching means is in a first state, the current conveyor circuit to monitor the current applied to its x-input, and in a second state to reproduce at its x-input a current applied to the x-input when the switching means was in its first state.

7. An integrator circuit as claimed in claim 6, wherein the current conveyor is a Class II current conveyor having its y-input coupled to a bias voltage rail, and a current mirror circuit coupled between a current memory cell and said bias voltage rail.

8. An integrator circuit as claimed in claim 3, comprising a differential amplifier having an inverting input connected to a source of bias potential, and a non-inverting input connected to the drain electrode of the field effect transistor in the first and/or second current memory cell, wherein the switch(es) is/are connected to the output of the amplifier instead of to the drain electrode of the respective transistor.

9. An integrator circuit as claimed in claim 8 and arranged to receive a differential input signal and to produce a differential output signal.

10. An integrator as claimed in claim 9, comprising first and second inputs for receiving the differential input signal and first and second outputs for making available the differential output signal, wherein the integrator comprises first and second integrators each as claimed in claim 1 the first and second integrators being identical in form with their outputs supplying the differential output signal.

11. An integrator circuit as claimed in claim 2 wherein the second current memory cell has a third output, said integrator circuit further comprising switching means whereby said third output is connected to the node when the input of the second current memory cell is connected to the node but not when the input of the first current memory cell is connected to the node.

12. An integrator as claimed in claim 11, wherein the second current memory cell has a fourth output which is connected via said switching means to the node when the input of the first current memory cell is connected to the node but not when the input of the second current memory cell is connected to the node.

13. An integrator circuit as claimed in claim 1, wherein at least one current memory cell comprises a MOS field effect transistor having a switch connected between its gate and drain electrodes, the input current being applied when the switch is closed and the output current being available when the switch is open, and means for controlling the operation of the switch by a clock signal synchronised with the sampling period of the input analog current.

14. An integrator circuit as claimed in claim 13, wherein a further capacitor, in addition to the inherent MOS transistor gate-source capacitance, is connected between the gate and source electrodes of the MOS transistor.

15. An integrator circuit as claimed in claim 14, wherein a cascode connected transistor is connected with its source-drain path between the drain electrode of the MOS transistor and its respective switch in at least of the current memory, 16. An integrator circuit as claimed in claim 1, wherein at least one current memory cell comprises a modified current conveyor circuit having an x-input connected to said circuit input, the circuit further comprising switching means synchronised with the sampling period of the input analog current for causing, when the switching means is in a first state, the current conveyor circuit to monitor the current applied to its x-input, and in a second state to reproduce at its x-input a current applied to the x-input when the switching means was in its first state.

17. An integrator circuit as claimed in claim 3, wherein the second current memory cell has a third output and the integrator circuit includes switching means whereby said third output is connected to the node when the input of the second current memory cell is connected to the node.

18. An integrator as claimed in claim 17, wherein the second current memory cell has a fourth input which is connected to the node when the input of the first current memory cell is connected via said switching means to the node but not when the input of the second current memory cell is connected to the node.

19. An integrator circuit comprising:
an input terminal for a sampled analog current signal to be integrated,
an output terminal for an integrated analog current signal,
first and second current memory cells,
a common circuit node,
means connecting an input of the first current memory cell to said common circuit node and an output thereof to an input of the second current memory cell,
means connecting a first output of the second current memory cell to the input of the first current memory cell and a second output of the second current memory cell to said outupt terminals,
a switching device for coupling the input terminal to the common circuit node,
switching means coupling the first and second current memory cells to said common circuit node, and wherein
a same element of the first current memory cell receives its input current and supplies its output current and a same element of the second current memory cell receives its input current and supplies an output current at its first output.

20. An integrator circuit as claimed in claim 19 wherein said same element of the first current memory cell comprises a first transistor and said same element of the second current memory cell comprises a second transistor,
said switching means comprising a first controlled switching device which applies the input current to the first transistor when the first switching device is closed and supplies the output current of the first current memory cell when the first switching device is open, said switching means further comprising a second controlled switching device which supplies the input current to the second transistor when the second switching device is closed and supplies the first output current when the second switching device is open, and wherein
said first and second switching devices are controlled by a clock signal synchronized with the sampling of the input analog current signal and in a manner so as to operate the first and second switching devices out of phase with one another.

21. An integrator circuit as claimed in claim 20 further comprising:
a first current source coupled to said common circuit node,
a second current source coupled to said output terminal, and wherein
the output of the first current memory cell is also connected to said common circuit node.

* * * * *

UNITED STATES PATENT AND TRADEMARK OFFICE
CERTIFICATE OF CORRECTION

PATENT NO. : 5,109,169
DATED : April 28, 1992
INVENTOR(S) : John B. Hughes

It is certified that error appears in the above-indentified patent and that said Letters Patent is hereby corrected as shown below:

IN THE ABSTRACT line 1, after "consisting" insert --of--.

Column 1, line 19, change "dated" to --data--.

IN THE CLAIMS

Col. 18, claim 1, line 3, change "outupt" to --output--

Col. 20, claim 10, line 6, after "1" insert --,-- (comma)

Col. 20, claim 15, line 5, after "least" insert --one-- after "memory" insert --cells--.

Col. 21, claim 18, line 3, after "connected" insert --via said switching means--

Col. 21, claim 19, line 15, change "terminals" to --terminal--

Signed and Sealed this

First Day of March, 1994

Attest:

BRUCE LEHMAN

Attesting Officer         Commissioner of Patents and Trademarks

UNITED STATES PATENT AND TRADEMARK OFFICE
CERTIFICATE OF CORRECTION

PATENT NO. : 5,109,169
DATED : APRIL 28, 1992
INVENTOR(S) : JOHN B. HUGHES

It is certified that error appears in the above-indentified patent and that said Letters Patent is hereby corrected as shown below:

Col. 21, Claim 17, Line 6, after "node" insert --but not when the input of the first current memory cell is connected to the node--.

Signed and Sealed this

Fifth Day of April, 1994

Attest:

BRUCE LEHMAN

*Attesting Officer*          *Commissioner of Patents and Trademarks*